(12) United States Patent
Gong

(10) Patent No.: US 11,409,195 B2
(45) Date of Patent: Aug. 9, 2022

(54) METHOD FOR FORMING PHOTORESIST

(71) Applicant: Wuhan China Star Optoelectronics Semiconductor Display Technology Co., Ltd., Wuhan (CN)

(72) Inventor: Wenliang Gong, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 413 days.

(21) Appl. No.: 16/349,269

(22) PCT Filed: Nov. 20, 2018

(86) PCT No.: PCT/CN2018/116306
§ 371 (c)(1),
(2) Date: May 12, 2019

(87) PCT Pub. No.: WO2020/077730
PCT Pub. Date: Apr. 23, 2020

(65) Prior Publication Data
US 2020/0166841 A1    May 28, 2020

(30) Foreign Application Priority Data
Oct. 16, 2018 (CN) .......................... 201811203935.4

(51) Int. Cl.
*G03F 7/039* (2006.01)
*C08G 73/18* (2006.01)
*G03F 7/40* (2006.01)

(52) U.S. Cl.
CPC ............. *G03F 7/039* (2013.01); *C08G 73/18* (2013.01); *G03F 7/40* (2013.01)

(58) Field of Classification Search
CPC .. G03F 7/039; G03F 7/40; C08G 73/18; C08J 3/24; C08J 3/09; C07D 233/64; C08L 71/02
See application file for complete search history.

(56) References Cited

U.S. PATENT DOCUMENTS

2007/0015087 A1   1/2007   Hanaki
2012/0219905 A1   8/2012   Ichikawa

FOREIGN PATENT DOCUMENTS

| CN | 1896873 | 1/2007 |
| CN | 1964997 | 5/2007 |
| CN | 107540855 | 1/2018 |
| CN | 107602816 | 1/2018 |
| EP | 1796446 | 4/2007 |

OTHER PUBLICATIONS

English Translation of CN 107540855 A; Wenliang Gong; Published: Jan. 5, 2018 (Year: 2018).*

* cited by examiner

*Primary Examiner* — Peter L Vajda
*Assistant Examiner* — Richard David Champion

(57) ABSTRACT

The present disclosure provides a photoresist. The photoresist is formed by a crosslinking polymerization reaction between a reactive group-containing biimidazole molecule and a nitrogen-containing compound.

2 Claims, 3 Drawing Sheets

METHOD FOR FORMING PHOTORESIST

RELATED APPLICATIONS

This application is a National Phase of PCT Patent Application No. PCT/CN2018/116306 having International filing date of Nov. 20, 2018, which claims the benefit of priority of Chinese Patent Application No. 201811203935.4 filed on Oct. 16, 2018. The contents of the above applications are all incorporated by reference as if fully set forth herein in their entirety.

FIELD AND BACKGROUND OF THE INVENTION

The present disclosure relates to a field in display technology, and more particularly, to photoresist and a method for forming same.

To solve a problem that display products have low contrast due to a strong outdoor light environment, a polarizer (POL) is generally disposed on display panels. However, polarizer results in loss of over 55% of light emitted from display panels. Moreover, polarizer is made of polyvinyl alcohol (PVA), which is thick in thickness (about 100 µm) and is fragile, and thus it is likely that polarizer is easily broken if it is bent, and cannot be used for bendable display products. By correspondingly forming R, G, B photoresist layers in R, G, B sub-pixels of organic light emitting diode (OLED) displays, effective light emission of a spectrum of light emitting layer (EL) is guaranteed to be over 60%. In the meanwhile, by forming black matrix in non-light-emitting area of OLED displays, reflectivity of a panel can effectively be reduced to be lower than 6%. Such technique is known as polarizer-less (POL-less).

Photoresist is classified to include positive photoresist and negative photoresist. Patterns in negative photoresist will swell when immersed in a solvent in development treatment. Thus, compared with positive photoresist, negative photoresist has lower pattern resolution. Based on this reason, positive photoresist has replaced negative photoresist to be the core in manufacturing semiconductors.

Hexaarylbiimidazole is a new photochromic material. Light can break C—N bond between two imidazole molecules to generate two free radicals. Mechanism of such a chemical reaction involves photochromism, and is shown as below:

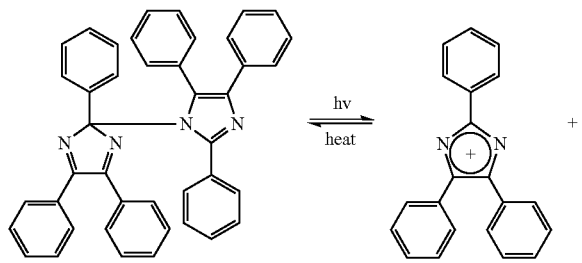

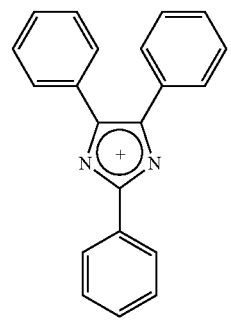

Light-induced reaction occurring on biimidazole can be understood as that light breaks a chemical bond between two imidazole molecules. This mechanism is basically the same as that of photolithography technology.

However, at present, there is no report about using biimidazole polymer as a photoresist.

Therefore, the present disclosure provides a photoresist and a method for forming same in order to solve problems existing in prior art.

SUMMARY OF THE INVENTION

The present disclosure provides a photoresist and a method for forming same. The photoresist leads to result that pattern where photolithography is performed has high resolution, and manufacturing yield rate and lifespan of OLED display panels are improved To solve the aforementioned problems, the present disclosure provides a photoresist formed by a crosslinking polymerization reaction between a reactive group-containing biimidazole molecule and a nitrogen-containing compound, wherein the photoresist, after being developed, is cured at a baking temperature lower than 90° C.

In one preferred embodiment of the present disclosure, the reactive group-containing biimidazole molecule is an alkynyl group-containing biimidazole molecule, and the nitrogen-containing compound is diazidohexane.

In one preferred embodiment of the present disclosure, the reactive group-containing biimidazole molecule is an ethylene oxide group-containing biimidazole molecule, and the nitrogen-containing compound is hexamethylenediamine.

In one preferred embodiment of the present disclosure, the reactive group-containing biimidazole molecule is a hydroxy-containing biimidazole molecule, and the nitrogen-containing compound is 1,6-hexamethylene diisocyanate.

In addition, the present disclosure provides a photoresist formed by a crosslinking polymerization reaction between a reactive group-containing biimidazole molecule and a nitrogen-containing compound.

In one preferred embodiment of the present disclosure, the reactive group-containing biimidazole molecule is an alkynyl group-containing biimidazole molecule, and the nitrogen-containing compound is diazidohexane.

In one preferred embodiment of the present disclosure, the reactive group-containing biimidazole molecule is an ethylene oxide group-containing biimidazole molecule, and the nitrogen-containing compound is hexamethylenediamine.

In one preferred embodiment of the present disclosure, the reactive group-containing biimidazole molecule is a hydroxy-containing biimidazole molecule, and the nitrogen-containing compound is 1,6-hexamethylene diisocyanate.

In one preferred embodiment of the present disclosure, the photoresist, after being developed, is cured at a baking temperature lower than 90° C.

Moreover, the present disclosure provides a method for forming a photoresist, comprising steps of: having a reactive group-containing biimidazole molecule and a nitrogen-containing compound to crosslink with each other.

In one preferred embodiment of the present disclosure, the reactive group-containing biimidazole molecule is an alkynyl group-containing biimidazole molecule, and the nitrogen-containing compound is diazidohexane; and the method further comprises:

a step (S11) of dissolving the alkynyl group-containing biimidazole molecule and diazidohexane at a molar ratio of 1:1.1 into dimethylformamide (DMF) that is contained in a 100 ml single-necked flask to obtain a uniformly mixed solution;

a step (S12) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;

a step (S13) of repeating the step (S12) three times;

a step (S14) of adding a molar ratio of 10% of copper(I) bromide into the mixed solution (in liquid nitrogen, 77K), and lifting and displacing the single-necked flask to a location under room temperature, and quickly stirring the mixed solution; and a step (S15) of leaving the mixed solution to rest for a few minutes, the mixed solution becoming viscous and completely cured due to a crosslinking polymerization reaction.

In one preferred embodiment of the present disclosure, the reactive group-containing biimidazole molecule is an ethylene oxide group-containing biimidazole molecule, and the nitrogen-containing compound is hexamethylenediamine; and the method further comprises:

a step (S21) of dissolving the ethylene oxide group-containing biimidazole molecule and hexamethylenediamine at a molar ratio of 1:1.2 into dimethylformamide (DMF) that is contained in a 100 ml single-necked flask to obtain a uniformly mixed solution;

a step (S22) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;

a step (S23) of repeating the step (S22) three times;

a step (S24) of lifting the single-necked flask, and heating the single-necked flask in an oil bath of 50° C. for 6 hours; and a step (S25) of taking out the single-necked flask, the mixed solution solidifying due to a crosslinking polymerization reaction.

In one preferred embodiment of the present disclosure, the reactive group-containing biimidazole molecule is a hydroxy-containing biimidazole molecule, and the nitrogen-containing compound is 1,6-hexamethylene diisocyanate; and the method further comprises:

a step (S31) of dissolving the hydroxy-containing biimidazole molecule and 1,6-hexamethylene diisocyanate at a molar ratio of 1:1.2 into dimethylformamide (DMF) that is contained in a 100 ml single-necked flask to obtain a uniformly mixed solution;

a step (S32) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;

a step (S33) of repeating the step (S32) three times;

a step (S34) of lifting the single-necked flask, and heating the single-necked flask in an oil bath of 50° C. for 6 hours; and a step (S35) of taking out the single-necked flask, the mixed solution solidifying due to a crosslinking polymerization reaction.

In one preferred embodiment of the present disclosure, the photoresist, after being developed, is cured at a baking temperature lower than 90° C.

Compared with prior art, the present disclosure is characterized by use of crosslinking hexaarylbiimidazole-based polymer as a positive photoresist. This leads to result that pattern where photolithography is performed has high resolution. In addition, use of crosslinking hexaarylbiimidazole-based polymer as the positive photoresist in polarizer-less (POL-less) for OLED display panels can make positive photoresist, after being developed, be cured at a baking temperature lower than 90° C., thus preventing light-emitting layer of OLED display panels from being damaged by high temperature. (Conventional photoresist used in OLED display manufacturing process is baked at 220° C.) Therefore, according to the present disclosure, manufacturing yield rate and lifespan of OLED display panels are improved.

DESCRIPTION OF SPECIFIC EMBODIMENTS OF THE INVENTION

Figure 1:
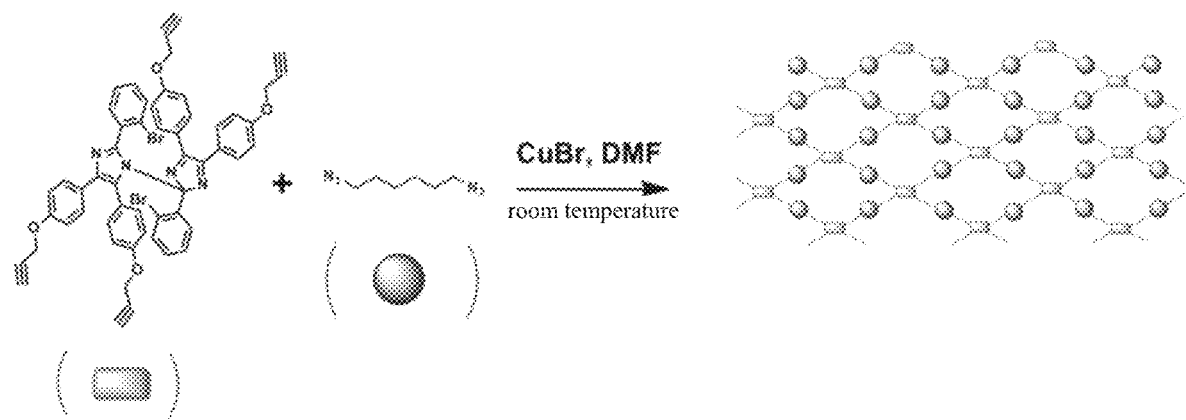
FIG. 1 is a schematic diagram showing a chemical mechanism involved in a method for forming a photoresist according to EMBODIMENT ONE of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a photoresist formed by a crosslinking polymerization reaction between a reactive group-containing biimidazole molecule and a nitrogen-containing compound. In addition, the present disclosure provides a method for forming a photoresist, comprising steps of having a reactive group-containing biimidazole molecule and a nitrogen-containing compound to crosslink with each other.

Embodiment One

A click reaction has high conversion and does not have side reactions, and can be performed at low temperatures, and thus plays an essential role in organic synthesis and polymeric synthesis. A click reaction between alkynyl group-containing compound and azide compound is shown as below.

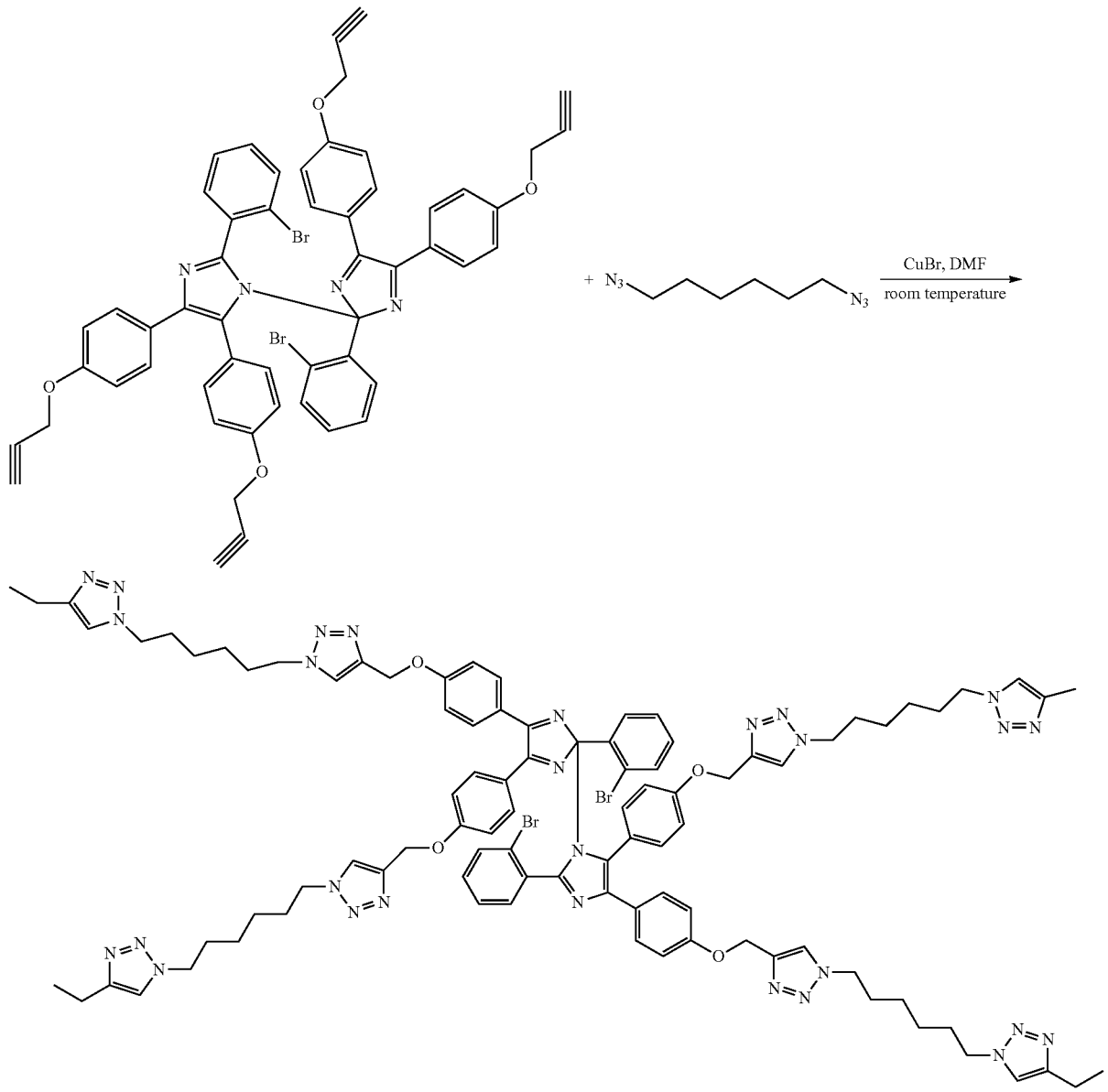

Therefore, inventors of the present disclosure devise a method for forming a positive photoresist by having tetraalkynyl group-substituted hexaarylbiimidazole and diazidohexane to crosslink with each other. FIG. 1 shows a chemical mechanism of such crosslinking polymerization reaction. Specifically, the method for forming this positive photoresist includes:

a step (S11) of dissolving the alkynyl group-containing biimidazole molecule and diazidohexane at a molar ratio of 1:1.1 into dimethylformamide (DMF) that is contained in a 100 ml single-necked flask to obtain a uniformly mixed solution;

a step (S12) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;

a step (S13) of repeating the step (S12) three times;

a step (S14) of adding copper(I) bromide into the mixed solution (in liquid nitrogen, 77K), according to a molar ratio of 10%, and lifting and displacing the single-necked flask to a location under room temperature, and quickly stirring the mixed solution;

a step (S15) of leaving the mixed solution to rest for a few minutes, the mixed solution becoming viscous and completely cured due to a crosslinking polymerization reaction.

Embodiment Two

An ethylene oxide compound can react with an amine compound at room temperature to form an ethanolamine compound. A chemical reaction between an ethylene oxide compound and an amine compound is shown as below.

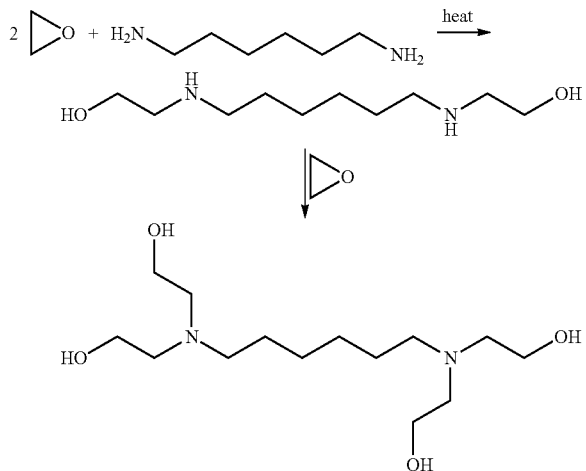

Figure 2:
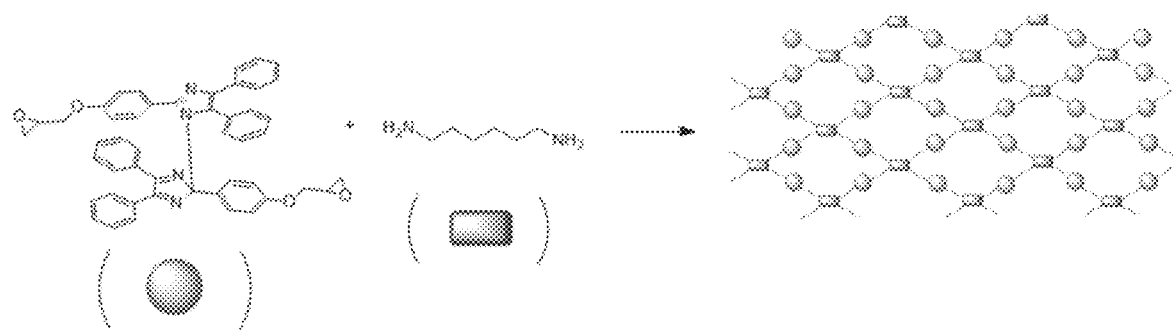
FIG. 2 is a schematic diagram showing a chemical mechanism involved in a method for forming a photoresist according to EMBODIMENT TWO of the present disclosure.

Therefore, inventors of the present disclosure devise a method for forming a positive photoresist by having tetraethylene oxide group-substituted hexaarylbiimidazole and hexamethylenediamine to crosslink with each other. FIG. 2 shows chemical mechanism of such a crosslinking polymerization reaction. Specifically, the method for forming this positive photoresist includes:

a step (S21) of dissolving an ethylene oxide group-containing biimidazole molecule and hexamethylenediamine at a molar ratio of 1:1.2 into dimethylformamide (DMF) that is contained in a 100 ml single-necked flask to obtain a uniformly mixed solution;

a step (S22) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;

a step (S23) of repeating the step (S22) three times;

a step (S24) of lifting the single-necked flask, and heating the single-necked flask in an oil bath of 50° C. for 6 hours; and a step (S25) of taking out the single-necked flask, the mixed solution solidifying due to a crosslinking polymerization reaction.

Embodiment Three

An alcohol compound can react with an isocyanate compound to form polyurethane. A chemical reaction between an alcohol compound and an isocyanate compound is shown as below.

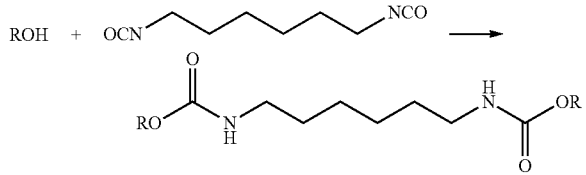

Figure 3:
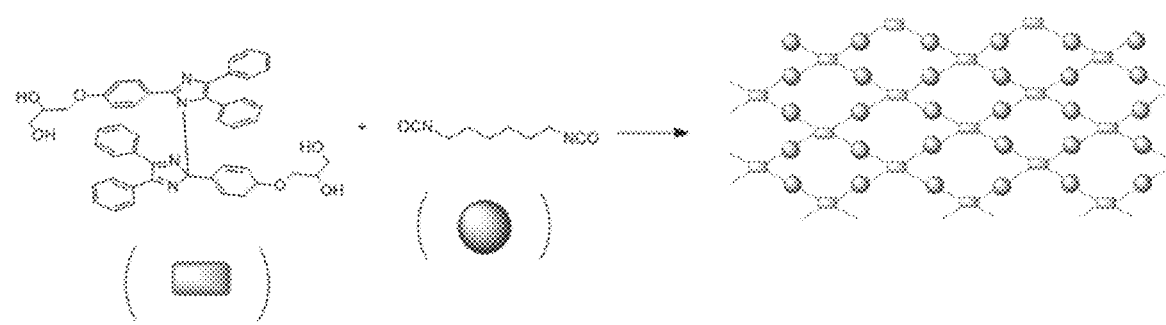
FIG. 3 is a schematic diagram showing a chemical mechanism involved in a method for forming a photoresist according to EMBODIMENT THREE of the present disclosure.

Therefore, inventors of the present disclosure devise a method for forming a positive photoresist by having tetrahydroxy-substituted hexaarylbiimidazole and 1,6-hexamethylene diisocyanate to crosslink with each other. FIG. 3 shows chemical mechanism of such a crosslinking polymerization reaction. Specifically, the method for forming this positive photoresist includes:

a step (S31) of dissolving a hydroxy-containing biimidazole molecule and 1,6-hexamethylene diisocyanate at a molar ratio of 1:1.2 into dimethylformamide (DMF) that is contained in a 100 ml single-necked flask to obtain a uniformly mixed solution;

a step (S32) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;

a step (S33) of repeating the step (S32) three times;

a step (S34) of lifting the single-necked flask, and heating the single-necked flask in an oil bath of 50° C. for 6 hours; and a step (S35) of taking out the single-necked flask, the mixed solution solidifying due to a crosslinking polymerization reaction.

Compared with prior art, the present disclosure is characterized by use of crosslinking hexaarylbiimidazole-based polymer as a positive photoresist. This causes a result that a pattern where photolithography is performed has high resolution. In addition, it is known that light emitting layer of OLED display panels cannot bear high baking temperatures (where baking temperature should be generally controlled to be lower than 100° C., and high baking temperatures might cause failure of light-emitting units or shorten lifespan of light emitting units in OLED display panels) in manufacturing OLED displays. However, in the present disclosure, using crosslinking hexaarylbiimidazole-based polymer as positive photoresist in polarizer-less (POL-less) for OLED display panels can make the positive photoresist, after being developed, be cured at a baking temperature lower than 90° C., thus preventing light emitting layers of OLED display panels from being damaged by high temperatures. (Conventional photoresist used in manufacturing OLED displays is baked at 220° C.) Therefore, in the present disclosure, yield rates and lifespan of OLED display panels are improved.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for forming a photoresist comprising:
a step (S11) of dissolving an alkynyl group containing a biimidazole molecule with a diazidohexane at a molar ratio of 1:1.1 into dimethylformamide (DMF) that is contained in a 100 ml single-necked flask to obtain a uniformly mixed solution;
a step (S12) of placing the single-necked flask into liquid nitrogen, wherein an oil pump is connected to the single-necked flask to vacuum the single-necked flask and to reduce pressure inside the single-necked in order to remove bubbles from the mixed solution, and bubbling nitrogen into the mixed solution;
a step (S13) of repeating the step (S12) three times;

a step (S14) of adding a molar ratio of 10% of copper(I) bromide into the mixed solution (in liquid nitrogen, 77K), and lifting and displacing the single-necked flask to a location under room temperature, and quickly stirring the mixed solution; and a step (S15) of leaving the mixed solution to rest for a few minutes, the mixed solution becoming viscous and completely cured due to a crosslinking polymerization reaction.

2. The method for forming the photoresist according to claim 1, wherein the photoresist, after being developed, is cured at a baking temperature lower than 90° C.

* * * * *